(12) United States Patent
Brantley et al.

(10) Patent No.: US 9,954,496 B2
(45) Date of Patent: Apr. 24, 2018

(54) MITIGATING AMPLIFIER POP NOISE

(71) Applicant: TEXAS INSTRUMENTS INCORPORATED, Dallas, TX (US)

(72) Inventors: Steven G. Brantley, Satellite Beach, FL (US); Bharath Karthik Vasan, Tucson, AZ (US); John Lawrence Caldwell, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/385,200

(22) Filed: Dec. 20, 2016

(65) Prior Publication Data

US 2017/0179893 A1      Jun. 22, 2017

Related U.S. Application Data

(60) Provisional application No. 62/270,495, filed on Dec. 21, 2015.

(51) Int. Cl.
  H03F 1/14      (2006.01)
  H03F 1/30      (2006.01)
  (Continued)

(52) U.S. Cl.
  CPC ............. H03F 1/305 (2013.01); H03F 3/187 (2013.01); H03F 3/3069 (2013.01);
  (Continued)

(58) Field of Classification Search
  CPC ......... H03F 1/305; H03F 3/45; H03G 1/0088; H03G 3/3026
  (Continued)

(56) References Cited

U.S. PATENT DOCUMENTS 7,142,057 B2    11/2006  Van Engelen et al.
7,777,574 B1    8/2010   Nielsen
(Continued)

OTHER PUBLICATIONS

Jiang et al., "Integrated Pop-Click Noise Suppression, EMI Reduction, and Short-Circuit Detection for Class-D Audio Amplifiers," IEEE Journal of Solid-State Circuits, vol. 48, No. 4, Apr. 2013, pp. 1099-1108.

(Continued)

*Primary Examiner* — Steven J Mottola
(74) *Attorney, Agent, or Firm* — Gregory J. Albin; Charles A. Brill; Frank D. Cimino

(57) ABSTRACT

At least some embodiments are directed to a system comprising an amplifier containing a first bias current source and configured to provide an output voltage at a node, a gain stage coupled to the node and comprising a second bias current source, and a buffer stage coupled to the node and comprising third and fourth bias current sources and an additional set of bias current sources, the third and fourth bias current sources are able to activate output transistors that are configured to increase current provided to a load. The system also comprises a controller configured to activate the first bias current source, to activate the second bias current source after the first bias current source is activated, to activate the bias current sources in the set after the first bias current source is activated, and to activate the third and fourth bias current sources after the first and second bias current sources are activated and after the bias current sources in the set are activated.

20 Claims, 4 Drawing Sheets

(51) Int. Cl.
*H03F 3/187* (2006.01)
*H03G 1/00* (2006.01)
*H03G 3/30* (2006.01)
*H03F 3/30* (2006.01)
*H03F 3/45* (2006.01)

(52) U.S. Cl.
CPC ..... *H03F 3/45085* (2013.01); *H03F 3/45596* (2013.01); *H03G 1/0023* (2013.01); *H03G 1/0088* (2013.01); *H03G 3/3005* (2013.01); *H03F 2200/03* (2013.01); *H03F 2200/375* (2013.01)

(58) Field of Classification Search
USPC .......................................... 330/51; 381/94.5
See application file for complete search history.

(56) References Cited

U.S. PATENT DOCUMENTS

| | | | |
|---|---|---|---|
| 8,139,786 B2* | 3/2012 | Berkhout | ............... H03F 1/305 381/94.1 |
| 8,965,010 B2 | 2/2015 | Sorace et al. | |
| 2008/0150636 A1* | 6/2008 | Wu | ......................... H03F 3/211 330/253 |
| 2014/0098974 A1 | 4/2014 | Viegas | |

OTHER PUBLICATIONS

Abdelfattah et al., "A 40 nm Fully Integrated 82 mW Stereo Headphone Module for Mobile Applications," IEEE Journal of Solid-State Circuits, vol. 39, No. 8, Aug. 2014, pp. 1702-1714.

Haishi et al., "Ways to Suppress Click and Pop for Class D Amplifiers," Journal of Semiconductors, vol. 33, No. 8, Aug. 2012, 5 pages.

MAX9890 Audio Click-Pop Suppressor Datasheet, 2014, http://www.maximintegrated.com/en/products/analog/audio/MAX9890.html#popuppdf, 12 pages.

International Search Report and Written Opinion, PCT/US2016/068080 dated Apr. 20, 2017 (7 pages).

* cited by examiner

MITIGATING AMPLIFIER POP NOISE

CROSS-REFERENCE TO RELATED APPLICATIONS

The present application claims priority to U.S. Provisional Patent Application No. 62/270,495, filed Dec. 21, 2015, titled "Mitigating Pop-Click Noise Into Headphones Loads," which is hereby incorporated herein by reference in its entirety.

BACKGROUND

Headphones, speakers, earbuds, and similar audio devices are often used to listen to audio recordings. Frequently, such audio devices are connected to audio jacks in electronic systems, such as smart phones, portable music players, laptop and desktop computers, and the like. The amplifier circuitry that drives the typical audio jack supplies a surge of current to the jack when the amplifier is enabled, and this current surge is audible to the listener as a "pop" or "click" noise. Such noise is unpleasant and detracts from the listening experience.

SUMMARY

At least some embodiments are directed to a system comprising an amplifier containing a first bias current source and configured to provide an output voltage at a node, a gain stage coupled to the node and comprising a second bias current source, and a buffer stage coupled to the node and comprising third and fourth bias current sources and an additional set of bias current sources, the third and fourth bias current sources are able to activate output transistors that are configured to increase current provided to a load. The system also comprises a controller configured to activate the first bias current source, to activate the second bias current source after the first bias current source is activated, to activate the bias current sources in the set after the first bias current source is activated, and to activate the third and fourth bias current sources after the first and second bias current sources are activated and after the bias current sources in the set are activated. One or more such embodiments may be supplemented using one or more of the following concepts, in any order and in any combination: further comprising an offset compensation circuit coupled to the node and to the amplifier, the offset compensation circuit configured to compensate an offset voltage introduced to the node by one or more transistors in the buffer stage; wherein the amplifier and the offset compensation circuit maintain the output voltage at the node at ground when the controller activates the third and fourth bias current sources; wherein the offset compensation circuit comprises one or more additional bias current sources and one or more additional transistors, and wherein emitter areas of the one or more additional transistors and currents provided by the one or more additional bias current sources result in the same current densities in the one or more additional transistors as the current densities in the one or more transistors in the buffer stage; wherein the controller is further configured to deactivate the first bias current source after the third and fourth bias current sources are activated; wherein the controller is further configured to close one or more switches in the amplifier to preclude the amplifier from applying a voltage or a current to the node; wherein the buffer stage couples to an audio output jack of a mobile electronic device; wherein the amplifier comprises multiple current mirrors; wherein the buffer stage includes an NPN transistor stack coupled to the third bias current source and a PNP transistor stack coupled to the fourth bias current source, the third and fourth bias current sources and the NPN and PNP transistor stacks configured to keep each of the output transistors in the buffer stage on when the other transistor in the pair is channeling current.

At least some embodiments are directed to a system, comprising: an amplifier comprising a first bias current source coupled to multiple current mirrors, a node of the amplifier positioned between first and second transistors of the amplifier and configured to provide current to the node, the amplifier further comprising multiple switches configured to regulate current flow through the first and second transistors. The system also comprises an offset compensation circuit, coupled to the amplifier, that includes second and third bias current sources and third and fourth transistors, the second and third bias current sources and the third and fourth transistors configured to reduce an offset voltage applied to the node. The system further comprises a gain stage coupled to the node. The system additionally comprises a buffer stage coupled to the node and comprising a fourth bias current source coupled to an emitter of a fifth transistor, a fifth bias current source coupled to an emitter of a sixth transistor, a sixth bias current source coupled to a collector of a seventh transistor, a seventh bias current source coupled to a collector of an eighth transistor. The buffer stage further comprises a ninth transistor having a base coupled to the sixth bias current source and a tenth transistor having another base coupled to the seventh bias current source, the collectors of the ninth and tenth transistors configured to couple to an audio device load. The buffer stage further comprises an eighth bias current source coupled to an NPN transistor stack and to an eleventh transistor, and an emitter of the eleventh transistor coupled to the base of the tenth transistor. The buffer stage further includes a ninth bias current source coupled to a PNP transistor stack and to a twelfth transistor, and it further includes an emitter of the twelfth transistor coupled to the base of the ninth transistor. One or more of these embodiments may be supplemented using one or more of the following concepts, in any order and in any combination: wherein the offset compensation circuit is positioned in a feedback loop of the amplifier; wherein each of the eighth and ninth bias current sources is configured to provide more current than each of the fourth, fifth, sixth, and seventh bias current sources; further comprising a controller configured to: activate the first, second, and third bias current sources; activate the fourth, fifth, sixth, and seventh bias current sources after the first, second, and third bias current sources have been activated; and activate the eighth and ninth bias current sources after the fourth, fifth, sixth, and seventh bias current sources have been activated; wherein the controller is configured to preclude the amplifier from affecting a voltage at the node after the eighth and ninth bias current sources have been activated; wherein the controller is configured to: deactivate the eighth and ninth bias current sources; deactivate the fourth, fifth, sixth, and seventh bias current sources after the eighth and ninth bias current sources have been deactivated; and deactivate the first, second, and third bias current sources after the fourth, fifth, sixth, and seventh bias current sources have been deactivated; wherein the third and fourth transistors in the offset compensation circuit include NPN and PNP transistors, wherein the fifth, seventh, and tenth transistors are NPN transistors, and wherein the sixth, eighth, and ninth transistors are PNP transistors.

At least some embodiments are directed to a method, comprising: activating an amplifier bias current in an amplifier and an offset compensation bias current in an offset compensation circuit; holding a voltage at an output node of the amplifier within a predetermined range from ground; activating a gain stage bias current and first and second pairs of buffer stage bias currents after activating the amplifier bias current and the offset compensation bias current; holding an output voltage of the buffer stage within the predetermined range from ground; and activating a third pair of buffer stage bias currents after activating the gain stage bias current and the first and second pairs of buffer stage bias currents and while the output voltage of the buffer stage is within the predetermined range from ground. One or more such embodiments may be supplemented using one or more of the following concepts, in any order and in any combination: further comprising deactivating the amplifier after activating the third pair of buffer stage bias currents; further comprising deactivating the third pair of buffer stage bias currents, then deactivating the gain stage bias current and the first and second pairs of buffer stage bias currents, then deactivating the amplifier bias current and the offset compensation bias current; further comprising maintaining activation of a pair of transistors coupled to sources providing the third pair of buffer stage bias currents.

BRIEF DESCRIPTION OF THE DRAWINGS

For a detailed description of various examples, reference will now be made to the accompanying drawings in which.

DETAILED DESCRIPTION

Disclosed herein are various embodiments of an amplifier circuit that is configured to drive an audio output jack in an electronic device, such as a smart phone, portable music player, or laptop computer. The amplifier circuit may eliminate or at least substantially mitigate the unpleasant "pop" or "click" that is audible when most amplifier circuits are enabled. In some examples, the amplifier circuit contains an auxiliary amplifier, an offset compensation circuit, a gain stage, and a buffer stage. Each of these amplifier circuit components contains one or more bias current sources. The bias current sources are activated in a particular sequence so that the audible "pop" is mitigated. In at least some embodiments, the sequence begins with the activation of the auxiliary amplifier bias current and the offset compensation circuit bias currents. These bias currents cause an output node of the auxiliary amplifier to be maintained at ground or within a predetermined range from ground. The output node of the auxiliary amplifier is the same node as the input to the buffer stage. Next, the bias current source in the gain stage is activated, as are the smaller bias current sources in the buffer stage. The buffer stage has an approximate gain of 1. Thus, the output voltage of the buffer stage—which is applied directly to the audio output jack and thus the audio device load coupled to the jack—is also kept at or within a predetermined range from ground.

While the output voltage of the buffer stage is kept at or near ground, the large bias current sources of the buffer stage are activated (termed "large" not because the current they provide is necessarily large, but because they activate transistors that may substantially increase current into the load). These are typically responsible for the audio "pop" since they indirectly provide a surge of current to the audio device load via the audio output jack, but because the output voltage of the buffer stage is forced to be at ground or near ground as these large bias current sources are activated, the "pop" is mitigated. Because the buffer stage contains transistors, the base-emitter voltage drops across some of the resistors may present a voltage offset at the input of the buffer stage (i.e., at the output of the auxiliary amplifier). The offset compensation circuit contains bias current sources and transistors similar to some of those in the buffer stage that negate this voltage offset so that the voltage at the input of the buffer stage is at ground or near ground. Thus, the offset compensation circuit further mitigates the unpleasant, audible "pop."

Figure 1:
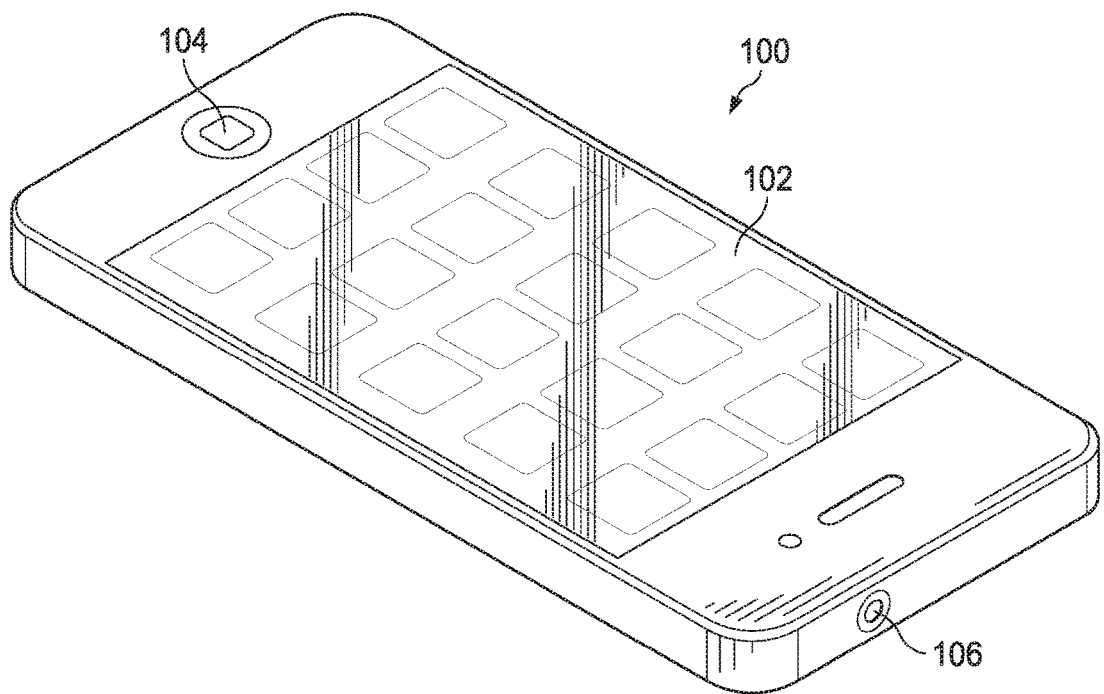
FIG. 1 depicts an electronic device having an audio jack that is driven by the amplifier circuit described herein.

FIG. 1 depicts an illustrative electronic device 100 in accordance with various embodiments. The electronic device 100 may be any electronic device that is capable of providing audio output via an audio output jack. The electronic device 100 may be, for instance and without limitation, a smartphone, a mobile computing device (e.g., laptop, tablet (e.g., an IPAD®), notebook), or a portable music player (e.g., an POCK)). Other types of electronic devices are contemplated and included within the scope of this disclosure. The electronic device 100 may include a display 102 (e.g., a touchscreen), one or more input devices 104 (e.g., buttons, dials, knobs), and an audio output jack 106 that is driven by the amplifier circuit described herein.

Figure 2:
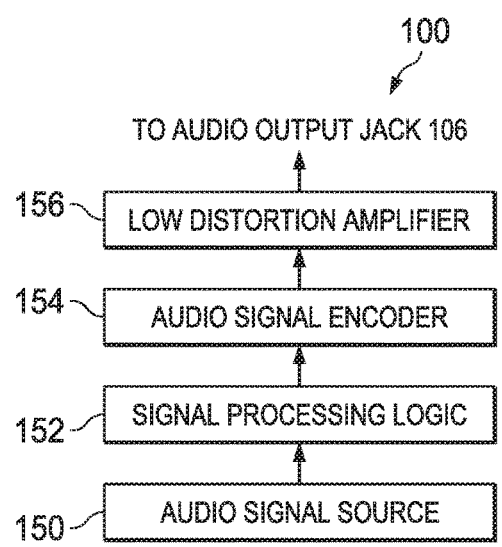
FIG. 2 is a block diagram depicting various components inside an electronic device.

FIG. 2 is a high-level block diagram depicting various components inside an electronic device 100. In particular, FIG. 2 depicts at least some of the components that participate in driving the audio output jack 106. The electronic device 100 includes an audio signal source 150, such as a storage device (e.g., a hard drive, non-volatile flash memory, external memory coupled to the electronic device) that stores audio files (e.g., music files), a wireless communication module (e.g., an antenna, Bluetooth) that streams audio files, and the like. The electronic device 100 also includes signal processing logic 152. The signal processing logic 152 may include, for instance and without limitation, one or more processors and/or one or more circuits that support the one or more processors in signal processing duties.

The electronic device 100 further comprises an audio signal encoder 154, which encodes the audio signal to be output via the audio output jack 106, and a low-distortion amplifier circuit 156. The amplifier circuit 156, which is described in greater detail in FIGS. 3-5, amplifies the encoded audio signal provided by the audio signal encoder 154. As mentioned and as will be described in additional detail, the low-distortion amplifier circuit 156 may mitigate or eliminate the unpleasant, audible "pop" associated with amplifier activation by activating bias current sources in various portions of the amplifier circuit in a particular sequence. Activating the different portions of the amplifier circuit in this sequence may ensure that the output of the amplifier is held low when the "pop" would typically be audible (i.e., when large bias current sources are activated and a large amount of current is injected via transistors into the load coupled to the audio output jack). This suppression of the output voltage when the "pop" would otherwise be audible may suppress the "pop" or eliminate it altogether.

Figure 3:
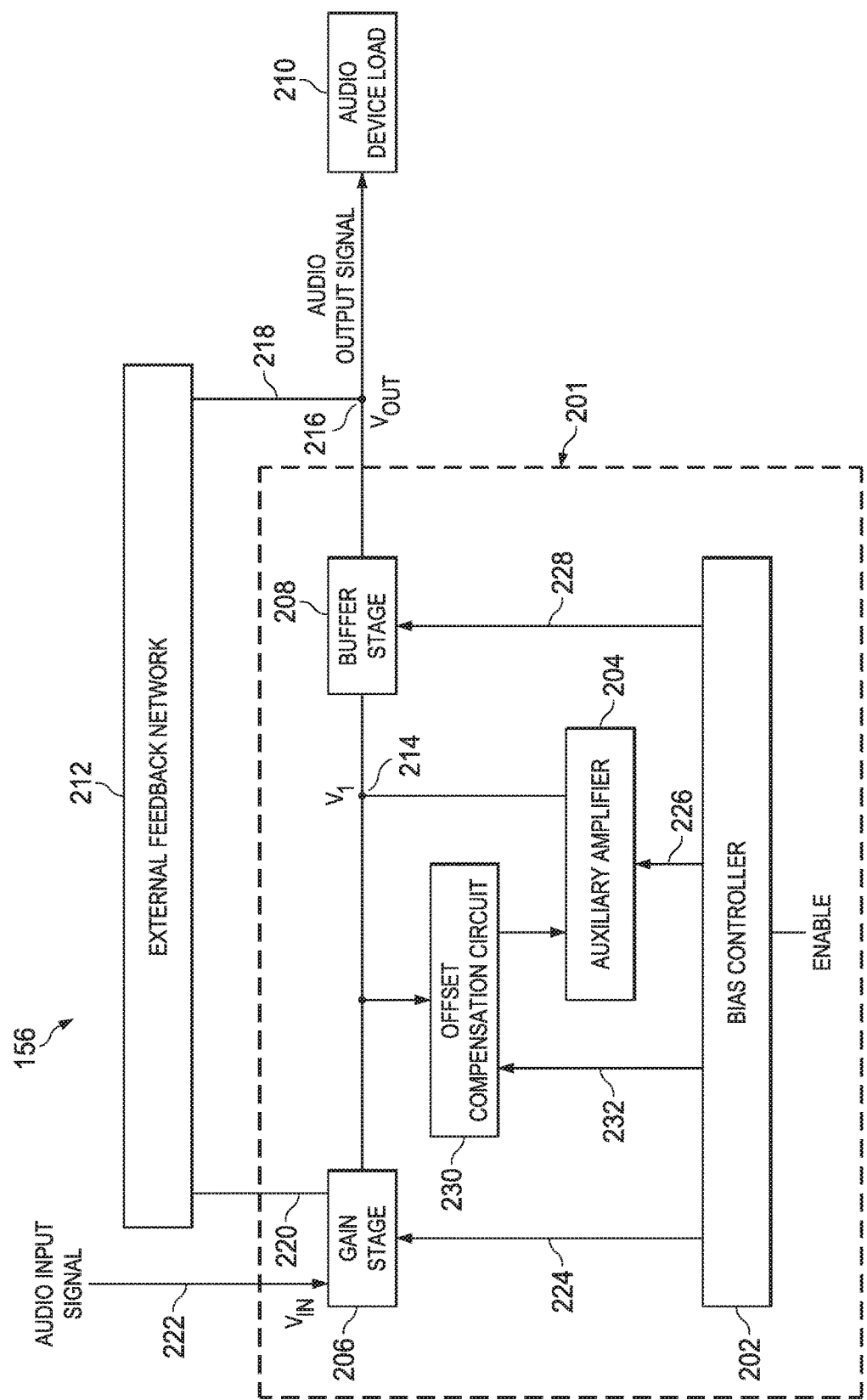
FIG. 3 is a block diagram depicting various embodiments of an amplifier circuit.
Figure 4:
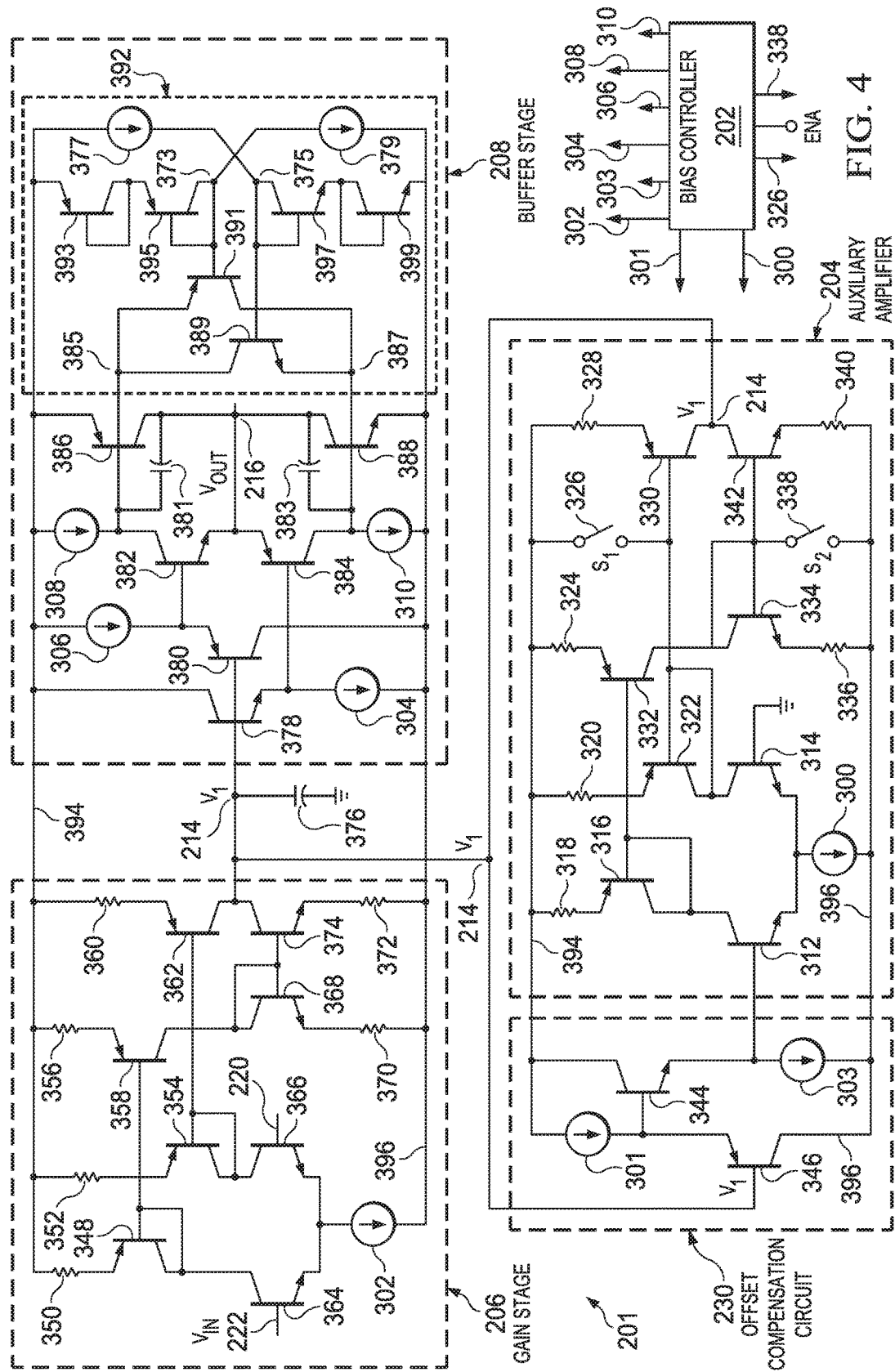
FIG. 4 is a circuit schematic diagram of various embodiments of an amplifier circuit.

FIG. 3 is a block diagram depicting various embodiments of the amplifier circuit 156. The circuit 156 includes a portion 201 (outlined to clarify which components of the amplifier circuit 156 are depicted in FIG. 4 below); a bias controller 202; an auxiliary amplifier 204; a gain stage 206; a buffer stage 208; an audio device load 210 (e.g., headphones or speakers that are connected to an audio output jack 106 (FIG. 1)); an external feedback network 212; a node 214 that couples to the output of the auxiliary amplifier 204, the output of the gain stage 206, and the input of the buffer stage 208. The voltage at the node 214 is represented as voltage $V_1$. The buffer stage 208 provides an output signal $V_{OUT}$ on the node 216. Connection 218 is positioned between node 216 and the external feedback network 212. (Although still technically part of node 216, the connection 218 is numbered separately for ease of discussion.) Connection 220 couples the output of the external feedback network 212 to the input of the gain stage 206. The gain stage 206 also receives an audio input signal 222 (e.g., from the audio signal encoder 154 as shown in FIG. 2). The differential between the audio input signal 222 and the signal at feedback connection 220 is $V_{IN}$. The amplifier circuit 156 also includes an offset compensation circuit 230, which uses the voltage $V_1$ at node 214 to provide a feedback loop to the auxiliary amplifier 204.

The bias controller 202 controls one or more bias current sources in the gain stage 206 via connection 224, in the auxiliary amplifier 204 via connection 226, in the buffer stage 208 via connection 228, and in the offset compensation circuit 230 via connection 232. The bias controller 202 is enabled and disabled by the control pin marked "ENABLE" (e.g., when ENABLE is HIGH, the bias controller 202 is enabled, and when ENABLE is LOW, the bias controller 202 is disabled). In some embodiments, the ENABLE pin is controlled using any suitable digital controller. In some embodiments, the ENABLE pin is automatically asserted when the power supply rails are powered and is automatically unasserted when the power supply rails are powered down.

In operation, when the bias controller 202 is enabled, the bias controller 202 activates the various bias current sources in the auxiliary amplifier 204, gain stage 206, buffer stage 208, and offset compensation circuit 230 in a specific, predetermined sequence. One goal of activating these bias current sources in a specific sequence is so that the output voltage $V_{OUT}$ at node 216 is held at or within a predetermined range from ground, and while $V_{OUT}$ is held at this low voltage level, the high bias current sources in the buffer stage 208—that is, the sources that are typically responsible for generating the audible "pop" noise—are enabled. Thus, because $V_{OUT}$ is forced low at the time that the "pop" is typically audible, no "pop" is audible.

An illustrative sequence in which the bias current sources may be enabled is as follows. First, the bias controller 202 enables a bias current source in the auxiliary amplifier 204, and it enables one or more bias current sources in the offset compensation circuit 230. The bias controller 202 may enable these bias current sources simultaneously or serially. The auxiliary amplifier 204 contains a network of transistors forming one or more current mirrors and the offset compensation circuit 230 contains a network of transistors as well. The transistors and bias current sources in each of these components are configured so that the voltage $V_1$ at node 214 is kept at ground or within a predetermined range of ground. If the offset compensation circuit 230 were excluded from the amplifier circuit 156, the buffer stage 208 would introduce a small voltage offset (e.g., a few millivolts) at $V_1$, and this offset can contribute to a "pop" sound. The offset compensation circuit 230 compensates for this offset at $V_1$, bringing $V_1$ to ground or at least within a predetermined range of ground.

After enabling the bias current sources in the auxiliary amplifier 204 and in the offset compensation circuit 230, the bias controller 202 enables one or more bias current sources in the gain stage 206 and in the buffer stage 208. The buffer stage 208 may contain several bias current sources. In some embodiments, the buffer stage 208 contains six bias current sources: four bias current sources that provide lesser current levels and which, when enabled, cause the output signal $V_{OUT}$ to reproduce $V_1$ with a gain of approximately 1 (e.g., within 10% of a gain of 1), and two additional bias current sources that provide greater current levels and which, when enabled, are primarily responsible for enabling transistors within the buffer stage 208 that drive the audio device load 210. In such embodiments, the bias controller 202 enables the weaker bias current sources in the buffer stage 208 first. Thus, for example, the bias controller 202 may enable the bias current source(s) in the gain stage 206 and the weaker bias current sources in the buffer stage 208. These bias current sources may be activated serially or simultaneously. This causes the output voltage $V_{OUT}$ to be held at about $V_1$ (e.g., within a 0.9-1.1 gain ratio of $V_1$), meaning that $V_{OUT}$ is held at ground or within a predetermined range of ground.

Finally, while $V_{OUT}$ is being held at ground or within a predetermined range of ground, the bias controller 202 activates the more powerful bias current sources in the buffer stage 208. As explained, these bias current sources, when activated, enable transistors that inject a large amount of current toward the audio device load 210. Thus, they are brought up while the output signal $V_{OUT}$ is being forced to ground or within a predetermined range of ground. In this way, the "pop" is no longer audible or may be significantly attenuated. The external feedback network 212 provides feedback from the output of the buffer stage 208 to the gain stage 206. The gain stage 206 receives audio signal 222 and feedback signal 220 and amplifies a difference between the two signals by a gain factor to generate an output.

FIG. 4 is a circuit schematic diagram of various embodiments of the portion 201 of the amplifier circuit 156. The portion 201 comprises the auxiliary amplifier 204, the gain stage 206, the buffer stage 208, the offset compensation circuit 230, and the bias controller 202. The bias controller 202 contains suitable circuitry—which, in some embodiments, may include a processor—to sequentially activate the various bias current sources 300-304, 306, 308, 310, 377, and 379 when the ENABLE pin is asserted (e.g., brought HIGH). When the ENABLE pin is unasserted (e.g., brought LOW), the bias controller 202 deactivates the various bias current sources in reverse sequential order. In some embodiments, the ENABLE pin is controlled using any suitable digital controller. In some embodiments, the ENABLE pin is automatically asserted when the power supply rails are powered and is automatically unasserted when the power supply rails are powered down. The bias controller 202 also may control switches (e.g., switches 326 and 338 in the auxiliary amplifier 204, discussed below) to activate and deactivate the auxiliary amplifier 204.

The auxiliary amplifier 204 comprises a bias current source 300 (e.g., 1 uA); the emitter of a transistor 312 coupled to the bias current source 300; the collector of a transistor 316 coupled to the collector of the transistor 312; a resistor 318 (e.g., 10 kOhms) coupled to the emitter of the transistor 316; the base of a transistor 332 coupled to the base of the transistor 316; the emitter of the transistor 332 coupled to a resistor 324 (e.g., 10 kOhms); the collector of a transistor 334 coupled to the collector of the transistor 332; and a resistor 336 (e.g., 10 kOhms) coupled to the emitter of the transistor 334. The resistors 318 and 324 couple to a positive voltage supply rail 394. The resistor 336 couples to a negative voltage supply rail 396. The base of the transistor 312 couples to a bias current source 303 in the offset compensation circuit 230. The base and the collector of the transistor 316 couple to each other. The base and the collector of the transistor 334 couple to each other.

The auxiliary amplifier 204 additionally includes a transistor 314 whose base is coupled to ground. The emitter of the transistor 314 couples to the bias current source 300, and the bias current source 300 couples to the negative voltage supply rail 396. The collector of the transistor 314 couples to the collector of the transistor 322. The emitter of the transistor 322 couples to resistor 320 (e.g., 10 kOhms). The base of the transistor 322 couples to the base of the transistor 330. The emitter of the transistor 330 couples to a resistor 328 (e.g., 10 kOhms). The collector of the transistor 330 couples to the collector of the transistor 342. The emitter of the transistor 342 couples to a resistor 340 (e.g., 10 kOhms). The resistors 320 and 328 couple to the positive voltage supply rail 394, and the resistor 340 couples to the negative voltage supply rail 396. The base and the collector of the transistor 322 couple to each other. The bases of the transistors 334 and 342 couple to each other. The auxiliary amplifier 204 includes a switch 326 coupled between the positive voltage supply rail 394 and the base of the transistor 330. The auxiliary amplifier 204 also comprises another switch 338 coupled between the bases of the transistors 334, 342 and the negative voltage supply rail 396. The auxiliary amplifier 204 outputs $V_1$ at a node 214 coupling the collectors of the transistors 330 and 342. The transistors 316 and 332 form a current mirror; the transistors 322 and 330 form another current mirror; and the transistors 334 and 342 form yet another current mirror.

The offset compensation circuit 230 comprises a bias current source 301 (e.g., 0.5 uA) and the bias current source 303 (e.g., 0.5 uA). The bias current source 301 couples to the positive voltage supply rail 394 and to the emitter of a transistor 346 and to the base of a transistor 344. The collector of the transistor 346 couples to the negative voltage supply rail 396. The collector of the transistor 344 couples to the positive voltage supply rail 394 and the emitter of the transistor 344 couples to the bias current source 303 and to the base of the transistor 312. The bias current source 303, in turn, couples to the negative voltage supply rail 396. The base of the transistor 346 couples to the node 214. A capacitor 376 (e.g., 20 pF) couples to ground and to the node 214. One function of the capacitor 376 is to stabilize the amplifier feedback loop.

The gain stage 206 comprises a bias current source 302 (e.g., 0.1 mA), which couples to the negative voltage supply rail 396 and to the emitters of transistors 364 and 366. The base of the transistor 364 receives audio input signal 222 (FIG. 3). The base of the transistor 366 couples to the output 220 of the external feedback network 212. The differential between these two bases is the input signal $V_{IN}$. The collector of the transistor 364 couples to the collector of the transistor 348. The emitter of the transistor 348 couples to a resistor 350 (e.g., 10 kOhms), which, in turn, couples to the positive voltage supply rail 394. The base and collector of the transistor 348 couple to each other. The base of the transistor 348 couples to the base of a transistor 358. The emitter of the transistor 358 couples to a resistor 356 (e.g., 10 kOhms), which, in turn, couples to the positive voltage supply rail 394. The collector of the transistor 358 couples to the collector of the transistor 368. The base and collector of the transistor 368 couple to each other. The resistor 370 (e.g., 10 kOhms) couples to the emitter of the transistor 368 and to the negative voltage supply rail 396.

The collector of the transistor 366 couples to the collector of the transistor 354. The emitter of the transistor 354 couples to a resistor 352 (e.g., 10 kOhms), which, in turn, couples to the positive voltage supply rail 394. The base and the collector of the transistor 354 couple to each other. The base of the transistor 354 couples to the base of the transistor 362. The emitter of the transistor 362 couples to a resistor 360 (e.g., 10 kOhms), which, in turn, couples to the positive voltage supply rail 394. The collector of the transistor 362 couples to the collector of a transistor 374. The emitter of the transistor 374 couples to a resistor 372 (e.g., 10 kOhms), which, in turn, couples to the negative voltage supply rail 396. The bases of the transistors 368 and 374 couple to each other. The node 214 couples to the collectors of the transistor 362 and 374.

The buffer stage 208 comprises bias current sources 304 (e.g., 50 uA), 306 (e.g., 50 uA), 308 (e.g., 0.5 mA), 310 (e.g., 0.5 mA), 377 (e.g., 50 uA), and 379 (e.g., 50 uA). The buffer stage 208 also comprises transistors 378, 380, 382, 384, 386, 388, 389, 391, 393, 395, 397, and 399. The bases of the transistors 378 and 380 couple to the node 214. The emitter of the transistor 378 couples to the bias current source 304 and to the base of the transistor 384. The collector of the transistor 378 couples to the positive voltage supply rail 394. The collector of the transistor 380 couples to the negative voltage supply rail 396. The emitter of the transistor 380 couples to the bias current source 306, which, in turn, couples to the positive voltage supply rail 394. The emitter of the transistor 380 couples to the base of the transistor 382. The collector of the transistor 382 couples to the bias current source 308, which, in turn, couples to the positive voltage supply rail 394. The collector of the transistor 382 also couples to the base of the transistor 386. The emitter of the transistor 384 couples to the emitter of the transistor 382. The collector of the transistor 384 couples to the bias current source 310 and to the base of the transistor 388. The emitter of the transistor 386 couples to the positive voltage supply rail 394, and the collector of the transistor 386 couples to a node 216. The collector of the transistor 388 also couples to the node 216. The emitter of the transistor 388 couples to the negative voltage supply rail 396. A capacitor 381 (e.g., 40 pF) couples to the base and collector of the transistor 386, and a capacitor 383 (e.g., 40 pF) couples to the base and collector of the transistor 388.

A transistor maintenance device (TMD) 392 (e.g., a Monticelli class AB controller) couples to the bases of the transistors 386 and 388. When one of the output transistors 386, 388 is not being used to transmit current to the load (e.g., a headphone set) at node 216, the TMD 392 ensures that that output transistor remains on so as to avoid activation delays when the transistor is needed. The TMD 392 comprises a transistor 389 having a collector coupled to node 385, which, in turn, couples to the base of transistor 386. The transistor 389 also comprises an emitter that couples to node 387, which, in turn, couples to the base of transistor 388. The base of transistor 389 couples to node 375, which, in turn, couples to the bias current source 377 and to the base and collector of transistor 397. The bias current source 377 couples to the positive voltage supply rail 394. The emitter of the transistor 397 couples to the collector and base of the transistor 399. The emitter of the transistor 399 couples to the negative voltage supply rail 396. Together, the transistors 388, 387, 397, and 399 form a translinear loop. The transistors 397 and 399 may be collectively referred to as an "NPN stack."

The TMD 392 further comprises a transistor 391 having an emitter coupled to the base of the transistor 386 via node 385 and a collector coupled to the base of the transistor 388 via node 387. The transistor 391 has a base that couples to node 373, which, in turn, couples to the bias current source 379 and the base and collector of transistor 395. The emitter of transistor 395 couples to the base and collector of the transistor 393. The emitter of the transistor 393 couples to the positive voltage supply rail 394. The bias current source 379 couples to the negative voltage supply rail 396. Collectively, the transistors 386, 391, 393, and 395 form another translinear loop. The transistors 393, 395 may be collectively referred to as a "PNP stack." Current flows from the bias current source 377 into the NPN stack via node 375. The node 375 also couples to the base of transistor 389. The collector of the transistor 389 couples to the base of the output transistor 386, and the emitter of the transistor 389 couples to the base of the output transistor 388. There is a translinear relationship of collector currents in the transistors 388, 389, 397, and 399 per Kirchhoff's voltage law. Thus, these transistors together form a translinear loop. The same is true for the bias current source 379, which flows into the PNP stack via node 373. The node 373 also couples to the base of transistor 391. The collector of the transistor 391 couples to the base of the output transistor 388, and the emitter of the transistor 391 couples to the base of the output transistor 386. The transistors 386, 391, 393, and 395 also form a translinear loop.

Figure 5:
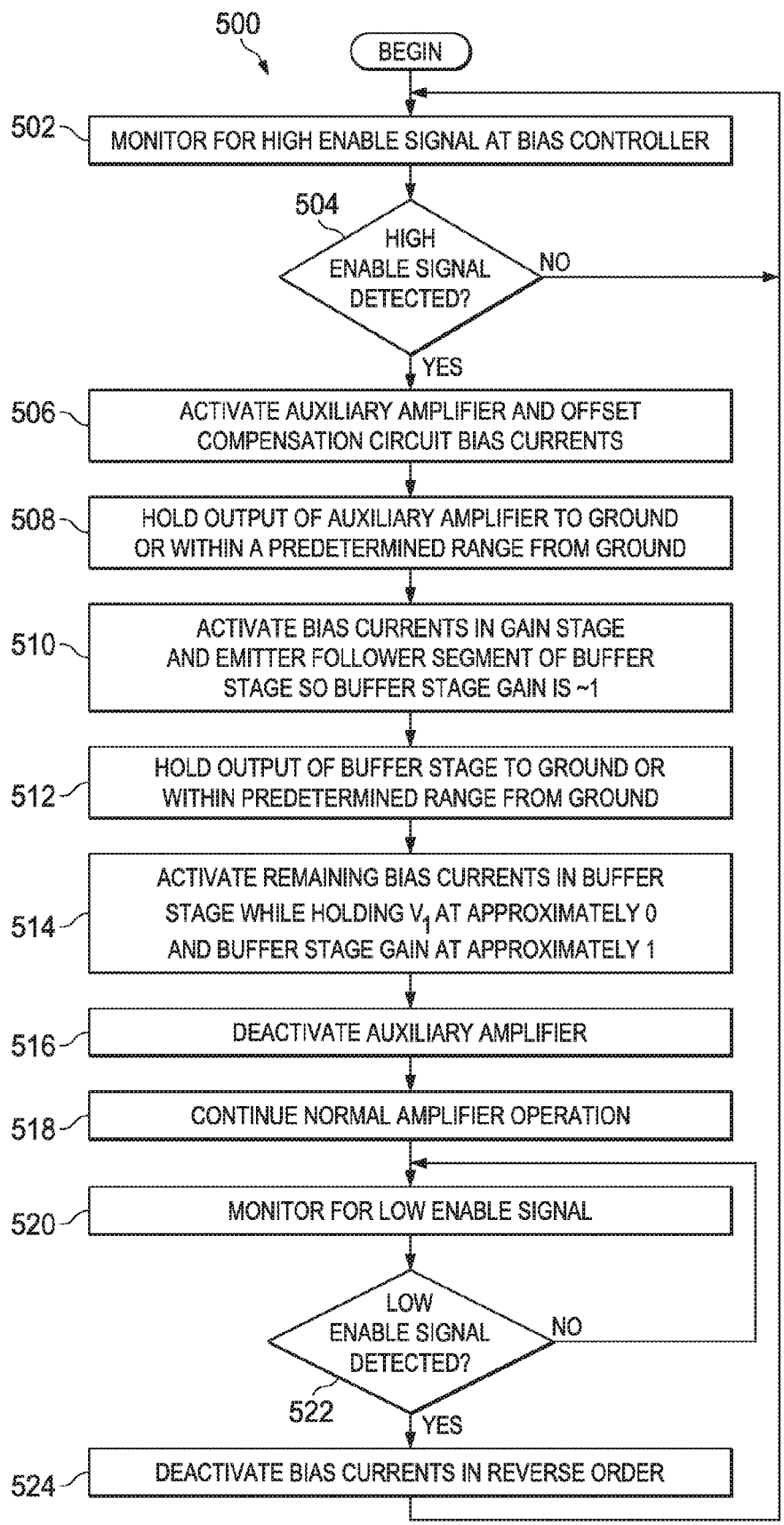
FIG. 5 is a flow diagram representing various embodiments of a method for operating an amplifier circuit.

The operation of the amplifier circuit as depicted in FIG. 4 is now described with respect to the flow diagram of method 500 in FIG. 5. The method 500 begins with the bias controller 202 monitoring the ENABLE input pin for a HIGH signal (step 502). (As explained above, in some embodiments, the ENABLE pin is controlled using any suitable digital controller. In some embodiments, the ENABLE pin is automatically asserted when the power supply rails are powered and is automatically unasserted when the power supply rails are powered down.) If a HIGH (or otherwise asserted) signal is detected at the ENABLE input pin (step 504), the method 500 includes activating the auxiliary amplifier and offset compensation circuit bias currents (step 506). Specifically, the step 506 includes activating the current bias sources 300, 301, and 303. These current bias sources may be activated simultaneously or serially.

When the bias current 300 is activated, the net effect of the auxiliary amplifier 204 is to push the voltage $V_1$ at node 214 toward the input at transistor 314—in this case, ground. Specifically, when the bias current source 300 is activated, the current is divided evenly between the transistors 312 and 314. At startup, the input of transistor 312 is powered to the negative voltage supply rail 396 and the input of transistor 314 is at ground. The current passing to the transistor 316 is mirrored to the transistor 332, and the current passing to the transistor 322 is mirrored to the transistor 330. The transistor 332 passes current to the transistor 334, and the transistor 330 passes current to the transistor 342. The transistors 330 and 342 form a high impedance node and set the gain (e.g., gain ratio of 10,000 or more) of the auxiliary amplifier 204. If the switch 326 is closed, no current flows through the transistor 330. Likewise, if the switch 338 is closed, no current flows through the transistor 342. In the event these switches are closed, the auxiliary amplifier 204 does not impact $V_1$.

As briefly mentioned, one or more of the transistors in the buffer stage 208 may introduce a voltage offset at $V_1$ due to their base-emitter voltage drops. The offset compensation circuit 330 compensates for this offset at $V_1$. The offset compensation circuit 330 is positioned in a feedback loop of the auxiliary amplifier 204. The currents provided by the bias current sources 301 and 303 are chosen to keep the current densities of the transistors 344 and 346 the same as those of the transistors in the buffer stage 208 that introduce the voltage offset to $V_1$. Thus, if the emitter areas of transistors 344 and 346 are scaled up or down by a factor of k compared to the transistors in the buffer stage 208 that introduce the voltage offset, the bias currents provided by the bias current sources 301 and 303 are likewise scaled up or down by the factor k. The voltage $V_1$ controls the base of the transistor 346, and the current sources 301 and 303 control the bases of the transistors 344 and 312, respectively. Together, these current sources and transistors cause the voltage input at the transistor 312 to be such that the auxiliary amplifier 204 compensates for the offset voltage at $V_1$ and brings $V_1$ to ground or within a predetermined range from ground. The continued operation of the auxiliary amplifier 204 (in tandem with the offset compensation circuit 330 after the buffer stage 208 is activated) results in holding the output of the auxiliary amplifier 204 to ground or within a predetermined range from ground (step 508).

The method 500 next comprises activating the bias currents in the gain stage and the emitter follower segment of the buffer stage so that the buffer stage gain is approximately 1 (step 510). Referring to FIG. 4, this step entails activating the bias current source 302 in the gain stage 206 and the bias current sources 304, 306, 308, and 310 in the buffer stage 208. The operation of the gain stage 206 is not described in detail here, as the circuitry is similar to that of the auxiliary amplifier 204.

Activating the bias currents 304, 306, 308, and 310 in the buffer stage 208 activates transistors 382, 384, 386, and 388 (the transistors 378, 380, 382, and 384 form the emitter follower portion of the buffer stage 208). The bias current sources 377 and 379 are not yet active; however, the bias currents 304, 306, 308, and 310 are sufficient to result in a $V_{OUT}$ output signal that—in comparison to $V_1$ provided to the bases of the transistors 378 and 380—provides a gain of approximately 1. This results in $V_{OUT}$ at node 216, like $V_1$, being held at ground or within a predetermined range of ground (step 512). Furthermore, because no current is yet flowing from bias current source 377, the NPN stack pulls the base of the transistor 389 low, which, in turn, pulls the emitter of the transistor 389 low, which, in turn, ensures that the base-to-emitter voltage at the transistor 388 is such that the transistor 388 is off. The same principle applies with respect to the bias current source 379 and the PNP stack, resulting in the transistor 386 being off. The time period during which $V_{OUT}$ is being held at ground or within a predetermined range of ground and when the output transistors 386, 388 are off is a suitable time to activate the bias current sources 377 and 379, since the resulting current injection via transistors 386, 388 and subsequent "pop" are made irrelevant by the fact that $V_{OUT}$ is being tightly controlled to ground or within a predetermined range of ground. Accordingly, the method 500 includes activating the remaining bias current sources in the buffer stage—that is, bias current sources 377 and 379—while holding $V_{OUT}$ at ground or within a predetermined range of ground (step 514). After the current bias sources 377, 379 are activated, the amplifier circuit is driving the audio device load via node 216, and the risk of a "pop" has passed. Accordingly, the method 500 comprises deactivating the auxiliary amplifier 204 (e.g., by closing the switches 326, 338) (step 516) and continuing normal operation of the amplifier circuit (step 518).

During normal operation, if no input signal is received at node 214, no output is provided on node 214. If a sinusoidal input signal is received at node 214 that includes a positive voltage (e.g., +1V) and a load (e.g., 10 Ohms) is coupled to the node 216, a current (e.g., 100 mA) is output to the node 216 via the transistor 386. During this time, the TMD 392 keeps the transistor 388 from turning off. If an input signal with a negative voltage (e.g., −1V) is received, a current (e.g., −100 mA) is output to the node 216 via the transistor 388. During this time, the TMD 392 keeps the transistor 386 from turning off.

The method 500 further comprises the bias controller 202 monitoring the ENABLE pin for a LOW (or otherwise unasserted) signal (step 520). When such a signal is received (step 522), the amplifier circuit is to be powered off. Accordingly, the bias currents are to be deactivated in reverse sequential order (step 524). Thus, the bias controller 202 reactivates the auxiliary amplifier 204 (e.g., by opening the switches 326, 338) so that the $V_{OUT}$ signal is held at ground or within a predetermined range of ground. Next, the bias current sources 377 and 379 are deactivated. Next, the smaller bias current sources 304, 306, 308, and 310 and the bias current source 302 are deactivated. After this, bias current sources 300, 301, and 303 are deactivated. The process then resumes monitoring for an asserted ENABLE signal at the bias controller 202 (step 502). The method 500 may be modified as desired, including by adding, deleting, modifying, or rearranging one or more steps.

Within each of the three groups of bias current sources that are sequentially activated and deactivated—that is, the group including bias current sources 300, 301, and 303; the group including bias current sources 302, 304, 306, 308, and 310; and the group including bias current sources 377 and 379—the bias current sources may be activated and/or deactivated simultaneously or serially. Thus, for example, the bias current sources 300, 301, and 303 may be activated and/or deactivated simultaneously or in series. Similarly, the bias current sources 302, 304, 306, 308, and 310 may be activated and/or deactivated simultaneously or in series. Likewise, the bias current sources 377 and 379 may be activated and/or deactivated simultaneously or in series. However, in at least some embodiments, the activation sequence entails activating all three of the bias current sources 300, 301, and 303 prior to activating any of the bias current sources 302, 304, 306, 308, and 310 and likewise, the bias current sources 302, 304, 306, 308, and 310 are activated before any of the bias current sources 377 and 379. In at least some embodiments, the deactivation sequence entails deactivating the bias current sources 377 and 379 before deactivating any of the bias current sources 302, 304, 306, 308, and 310, and it includes deactivating the sources 302, 304, 306, 308, and 310 before deactivating any of the bias current sources 300, 301, and 303.

The above discussion is meant to be illustrative of various embodiments. Numerous variations and modifications will become apparent to those skilled in the art once the above disclosure is fully appreciated. It is intended that the following claims be interpreted to embrace all such variations and modifications.

What is claimed is:

1. A system, comprising:
an amplifier containing a first bias current source and configured to provide an output voltage at a node;
a gain stage coupled to the node and comprising a second bias current source;
a buffer stage coupled to the node and comprising third and fourth bias current sources and an additional set of bias current sources, the third and fourth bias current sources are able to activate output transistors that are configured to increase current provided to a load; and
a controller configured to activate the first bias current source, to activate the second bias current source after the first bias current source is activated, to activate the bias current sources in the set after the first bias current source is activated, and to activate the third and fourth bias current sources after the first and second bias current sources are activated and after the bias current sources in the set are activated.

2. The system of claim 1, further comprising an offset compensation circuit coupled to the node and to the amplifier, the offset compensation circuit configured to compensate an offset voltage introduced to the node by one or more transistors in the buffer stage.

3. The system of claim 2, wherein the amplifier and the offset compensation circuit maintain the output voltage at the node at ground when the controller activates the third and fourth bias current sources.

4. The system of claim 2, wherein the offset compensation circuit comprises one or more additional bias current sources and one or more additional transistors, and wherein emitter areas of the one or more additional transistors and currents provided by the one or more additional bias current sources result in the same current densities in the one or more additional transistors as the current densities in the one or more transistors in the buffer stage.

5. The system of claim 1, wherein the controller is further configured to deactivate the first bias current source after the third and fourth bias current sources are activated.

6. The system of claim 1, wherein the controller is further configured to close one or more switches in the amplifier to preclude the amplifier from applying a voltage or a current to the node.

7. The system of claim 1, wherein the buffer stage couples to an audio output jack of a mobile electronic device.

8. The system of claim 1, wherein the amplifier comprises multiple current mirrors.

9. The system of claim 1, wherein the buffer stage includes an NPN transistor stack coupled to the third bias current source and a PNP transistor stack coupled to the fourth bias current source, the third and fourth bias current sources and the NPN and PNP transistor stacks configured to keep each of the output transistors in the buffer stage on when the other transistor in the pair is channeling current.

10. A system, comprising:
an amplifier comprising a first bias current source coupled to multiple current mirrors, a node of the amplifier positioned between first and second transistors of the amplifier and configured to provide current to the node, the amplifier further comprising multiple switches configured to regulate current flow through the first and second transistors;
an offset compensation circuit, coupled to the amplifier, that includes second and third bias current sources and third and fourth transistors, the second and third bias current sources and the third and fourth transistors configured to reduce an offset voltage applied to the node;
a gain stage coupled to the node; and
a buffer stage coupled to the node and comprising a fourth bias current source coupled to an emitter of a fifth transistor, a fifth bias current source coupled to an emitter of a sixth transistor, a sixth bias current source coupled to a collector of a seventh transistor, a seventh bias current source coupled to a collector of an eighth transistor, the buffer stage further comprising a ninth transistor having a base coupled to the sixth bias current source and a tenth transistor having another base coupled to the seventh bias current source, the collectors of the ninth and tenth transistors configured to couple to an audio device load,
wherein the buffer stage further comprises an eighth bias current source coupled to an NPN transistor stack and to an eleventh transistor, an emitter of the eleventh transistor coupled to the base of the tenth transistor, and wherein the buffer stage further includes a ninth bias current source coupled to a PNP transistor stack and to a twelfth transistor, an emitter of the twelfth transistor coupled to the base of the ninth transistor.

11. The system of claim 10, wherein the offset compensation circuit is positioned in a feedback loop of the amplifier.

12. The system of claim 10, wherein each of the eighth and ninth bias current sources is configured to provide more current than each of the fourth, fifth, sixth, and seventh bias current sources.

13. The system of claim 10, further comprising a controller configured to:
activate the first, second, and third bias current sources;
activate the fourth, fifth, sixth, and seventh bias current sources after the first, second, and third bias current sources have been activated; and
activate the eighth and ninth bias current sources after the fourth, fifth, sixth, and seventh bias current sources have been activated.

14. The system of claim 13, wherein the controller is configured to preclude the amplifier from affecting a voltage at the node after the eighth and ninth bias current sources have been activated.

15. The system of claim 10, wherein the controller is configured to:
deactivate the eighth and ninth bias current sources;
deactivate the fourth, fifth, sixth, and seventh bias current sources after the eighth and ninth bias current sources have been deactivated; and
deactivate the first, second, and third bias current sources after the fourth, fifth, sixth, and seventh bias current sources have been deactivated.

16. The system of claim 10, wherein the third and fourth transistors in the offset compensation circuit include NPN and PNP transistors, wherein the fifth, seventh, and tenth transistors are NPN transistors, and wherein the sixth, eighth, and ninth transistors are PNP transistors.

17. A method, comprising:
activating an amplifier bias current in an amplifier and an offset compensation bias current in an offset compensation circuit;
holding a voltage at an output node of the amplifier within a predetermined range from ground;
activating a gain stage bias current and first and second pairs of buffer stage bias currents after activating the amplifier bias current and the offset compensation bias current;
holding an output voltage of the buffer stage within the predetermined range from ground; and
activating a third pair of buffer stage bias currents after activating the gain stage bias current and the first and second pairs of buffer stage bias currents and while the output voltage of the buffer stage is within the predetermined range from ground.

18. The method of claim 17, further comprising deactivating the amplifier after activating the third pair of buffer stage bias currents.

19. The method of claim 17, further comprising deactivating the third pair of buffer stage bias currents, then deactivating the gain stage bias current and the first and second pairs of buffer stage bias currents, then deactivating the amplifier bias current and the offset compensation bias current.

20. The method of claim 17, further comprising maintaining activation of a pair of transistors coupled to sources providing the third pair of buffer stage bias currents.

* * * * *